United States Patent
Park et al.

(10) Patent No.: US 11,943,985 B2
(45) Date of Patent: Mar. 26, 2024

(54) LIGHT-EMITTING DEVICE AND LIGHT-EMITTING DISPLAY DEVICE INCLUDING THE SAME

(71) Applicant: LG Display Co., Ltd., Seoul (KR)

(72) Inventors: Jin Ho Park, Goyang-si (KR); Kyu Il Han, Paju-si (KR); Chang Hwan Kwak, Seoul (KR); Dong Hyeok Lim, Paju-si (KR); Hwa Yong Shin, Goyang-si (KR); Ji Hyung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 166 days.

(21) Appl. No.: 17/341,051

(22) Filed: Jun. 7, 2021

(65) Prior Publication Data

US 2022/0208876 A1   Jun. 30, 2022

(30) Foreign Application Priority Data

Dec. 24, 2020   (KR) .................. 10-2020-0183667

(51) Int. Cl.
| | | |
|---|---|---|
| H10K 59/35 | (2023.01) | |
| H10K 50/12 | (2023.01) | |
| H10K 50/18 | (2023.01) | |

(52) U.S. Cl.
CPC ........... H10K 59/353 (2023.02); H10K 50/12 (2023.02); H10K 50/18 (2023.02)

(58) Field of Classification Search
CPC ............ H01L 27/3218; H01L 51/5024; H01L 51/5096; H01L 51/5012; H01L 51/5016; H01L 2251/5384; H01L 2251/558; H01L 51/5278; H01L 27/3244; H01L 27/3211; H01L 51/5262; H01L 2251/55; H01L 51/50–56; H01L 51/0032–0095; H01L 27/32; H01L 2251/50–568; H01L 51/504–5044; H01L 27/3209; B32B 2457/206

See application file for complete search history.

(56) References Cited

U.S. PATENT DOCUMENTS

2006/0279203 A1   12/2006   Forrest et al.
2015/0188087 A1   7/2015   Lee
(Continued)

FOREIGN PATENT DOCUMENTS

| KR | 10-0657892 B1 | 12/2006 |
| KR | 10-1633135 B1 | 6/2016 |

(Continued)

OTHER PUBLICATIONS

Heimel et al., "Unicolored phosphor-sensitized fluorescence for efficient and stable blue OLEDs", 8 pages, www.nature.com/naturecommunications, Nov. 2018.

(Continued)

*Primary Examiner* — Mohammad A Rahman
(74) *Attorney, Agent, or Firm* — Birch, Stewart, Kolasch & Birch, LLP

(57) ABSTRACT

Discussed are a light-emitting device and a light-emitting display device having improved efficiency and increased lifespan. A plurality of stacks is provided between an anode and a cathode for at least a subpixel to emit a predetermined color, and emissive layers in different stacks include the same color-based materials having different luminous properties.

17 Claims, 9 Drawing Sheets

(56) References Cited

U.S. PATENT DOCUMENTS

| | | | |
|---|---|---|---|
| 2017/0179418 A1* | 6/2017 | Lee | H10K 50/15 |
| 2017/0346029 A1* | 11/2017 | Kim | H01L 51/5016 |
| 2019/0165294 A1 | 5/2019 | Forrest et al. | |
| 2020/0194689 A1* | 6/2020 | Seo | H10K 50/11 |
| 2022/0231248 A1* | 7/2022 | Yamazaki | H10K 50/17 |

FOREIGN PATENT DOCUMENTS

| | | |
|---|---|---|
| KR | 10-2018-0062220 A | 6/2018 |
| KR | 10-2018-0078637 A | 7/2018 |

OTHER PUBLICATIONS

Wu et al., "C 60 / N, N 1,2 '-bis(I-naphthyl)- N, N' -diphenyl-1, 1'-biphenyl-4,4'-diamine:MoO 3 as the interconnection layer for high efficient tandem blue fluorescent organic light-emitting diodes", Applied Physics Letters, vol. 102, 2013, pp. 243302-1-243302-4.

\* cited by examiner

LIGHT-EMITTING DEVICE AND LIGHT-EMITTING DISPLAY DEVICE INCLUDING THE SAME

CROSS-REFERENCE TO RELATED APPLICATIONS

This application claims the benefit of priority to Korean Patent Application No. 10-2020-0183667, filed in the Republic of Korea on Dec. 24, 2020, the entire contents of which are hereby expressly incorporated by reference as if fully set forth herein into the present application.

BACKGROUND OF THE INVENTION

Field of the Invention

The present invention relates to a light-emitting device, and more particularly to a light-emitting device configured such that emissive layers of different stacks are different in structure from each other, whereby both the lifespan and efficiency of the light-emitting device are improved, and to a light-emitting display device including the same.

Discussion of the Related Art

Recently, with the advent of the information age, the field of displays that can visually display electrical information signals has developed rapidly. In response to this, various kinds of display devices having excellent characteristics, such as a small thickness, a low weight, and low power consumption, have been developed and have rapidly replaced existing cathode ray tubes (CRTs).

Among various display devices, a light-emitting display device having a light-emitting device in a display panel is considered a competitive application because it does not require a separate light source and enables realization of a compact device design and vivid color display.

In the case in which a single stack including an emissive layer and common layers provided on and under the emissive layer is provided between electrodes in order to realize a light-emitting device, it can be difficult to improve efficiency of the light-emitting device to a predetermined level or more. In order to address this limitation, a structure having a plurality of stacks is proposed. In this case, however, it can be difficult to improve both efficiency and lifespan of the light-emitting device.

SUMMARY OF THE INVENTION

Accordingly, the present invention is directed to a light-emitting device and a light-emitting display device including the same that substantially obviate one or more problems due to limitations and disadvantages of the related art.

A light-emitting device and a light-emitting display device including the same are configured such that a plurality of stacks is provided between an anode and a cathode for at least a subpixel configured to emit a predetermined color and such that emissive layers in different stacks include the same color-based materials (or same color emitting materials) having different luminous properties, whereby the lifespan thereof is increased while efficiency thereof is improved.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a light-emitting device includes an anode and a cathode opposite each other, a charge generation layer provided between the anode and the cathode, a first stack provided between the anode and the charge generation layer, the first stack including a first emissive layer having a first dopant and a first fluorescent dopant, and a second stack provided between the charge generation layer and the cathode, the second stack overlapping the first stack, the second stack including a second emissive layer configured to emit the same color-based light (or the same color light) as the first emissive layer, the second emissive layer at least further having a non-fluorescent dopant, compared to the first emissive layer.

In another aspect of the present invention, a light-emitting display device includes a substrate having a plurality of subpixels, an anode provided at each of the plurality of subpixels, a cathode provided over the plurality of subpixels, the cathode being opposite the anode, a charge generation layer provided between the anode and the cathode, a first stack provided between the anode and the charge generation layer, and a second stack provided between the charge generation layer and the cathode, the second stack overlapping the first stack, wherein at least one of the subpixels includes a first emissive layer having a first host and a first fluorescent dopant in the first stack and a second emissive layer configured to emit an identical color-based light (or the same color light) to the first emissive layer in the second stack, the second emissive layer at least further having a non-fluorescent dopant, compared to the first emissive layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
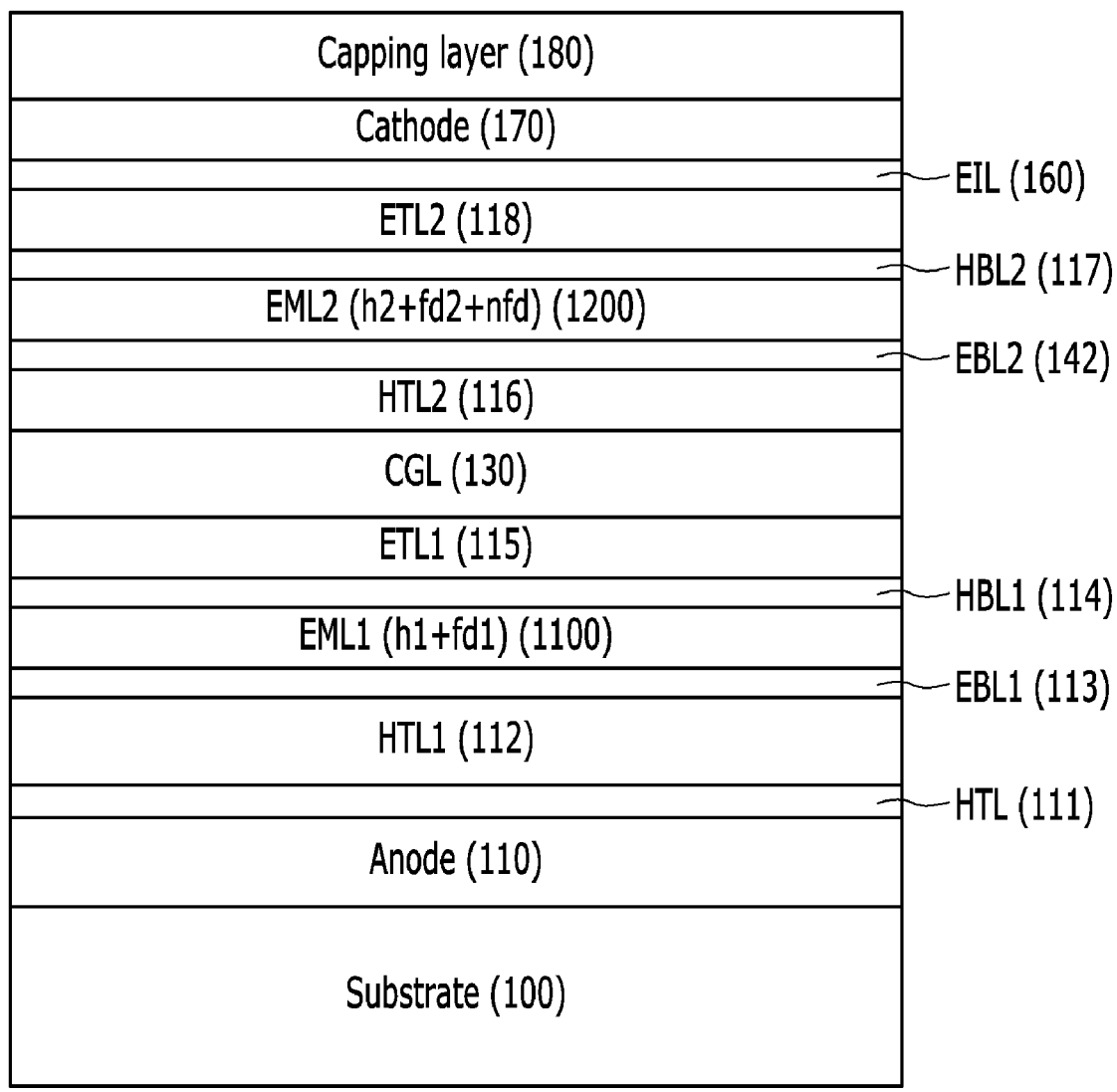
FIG. 1 is a sectional view showing a light-emitting device according to a first embodiment of the present invention.

Hereinafter, embodiments will be described with reference to the accompanying drawings. In the drawings, the same or similar elements are denoted by the same reference numerals even though they are depicted in different drawings. In the following description, a detailed description of known functions and configurations incorporated herein will be omitted when it can make the subject matter of the disclosure rather unclear. In addition, names of components used in the following description are selected in consideration of ease in preparing the specification, and can be different from names of parts of an actual product.

In the drawings for explaining the exemplary embodiments of the present invention, for example, the illustrated shape, size, ratio, angle, and number are given by way of example, and thus, are not limitative of the disclosure of the present invention. Throughout the present specification, the same reference numerals designate the same constituent elements. In addition, in the following description of the present invention, a detailed description of known functions and configurations incorporated herein will be omitted when it can make the subject matter of the present invention rather unclear. The terms "comprises", "includes", and/or "has", used in this specification, do not preclude the presence or addition of other elements unless used along with the term "only." The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "aside", or the like, one or more other parts can be located between the two parts unless the term "directly" or "closely" is used therewith.

In the description of the various embodiments of the present invention, when describing temporal relationships, for example, when the temporal relationship between two actions is described using "after", "subsequently", "next", "before", or the like, the actions may not occur in succession unless the term "immediately" or "directly" is used therewith.

In the description of the various embodiments of the present invention, although terms such as, for example, "first" and "second" can be used to describe various elements, these terms are merely used to distinguish the same or similar elements from each other. Therefore, in the present specification, an element modified by "first" can be the same as an element modified by "second" within the technical scope of the present invention unless otherwise mentioned.

The respective features of the various embodiments of the present invention can be partially or wholly coupled to and combined with each other, and various technical linkages therebetween and operation methods thereof are possible. These various embodiments can be performed independently of each other, or can be performed in association with each other.

In this specification, the term "doped" can preferably mean that a material of any layer, which has physical properties (e.g., N-type and P-type, or an organic material and an inorganic material) different from the material that occupies the greatest weight percentage of the corresponding layer, is added to the material accounting for the greatest weight percentage in an amount corresponding to a weight percentage of less than 30%. In other words, a "doped" layer can preferably mean a layer in which a host material and a dopant material of any layer are distinguishable from each other in consideration of the weight percentages thereof.

In addition, the term "undoped" can preferably refer to all cases excluding the case that corresponds to the term "doped". For example, when any layer is formed of a single material or is formed of a mixture of materials having the same or similar properties, the layer is an "undoped" layer. For example, when at least one of constituent materials of any layer is of a P-type and not all of the other constituent materials of the layer are of an N-type, the layer is an "undoped" layer. For example, when at least one of the constituent materials of any layer is an organic material and not all of the other constituent materials of the layer are an inorganic material, the layer is an "undoped" layer. For example, when all constituent materials of any layer are organic materials, at least one of the constituent materials is of an N-type, at least another constituent material is of a P-type, and the weight percent of the N-type material is less than 30% or the weight percent of the P-type material is less than 30%, the layer is a "doped" layer.

Meanwhile, in this specification, an electroluminescence (EL) spectrum is calculated via the product of (1) a photoluminescence (Pt) spectrum that represents unique properties of an emissive material such as a dopant or host material included in an organic emissive layer and (2) an outcoupling emittance spectrum curve determined depending on the structure and optical properties of an organic light-emitting device including thicknesses of organic layers such as an electron transport layer.

Hereinafter, a light-emitting device according to one or more embodiments of the present invention and a light-emitting display device including the same will be described with reference to the accompanying drawings. All the components of the light-emitting device as well as the light emitting display device according to all embodiments of the present disclosure are operatively coupled and configured.

Figure 2:
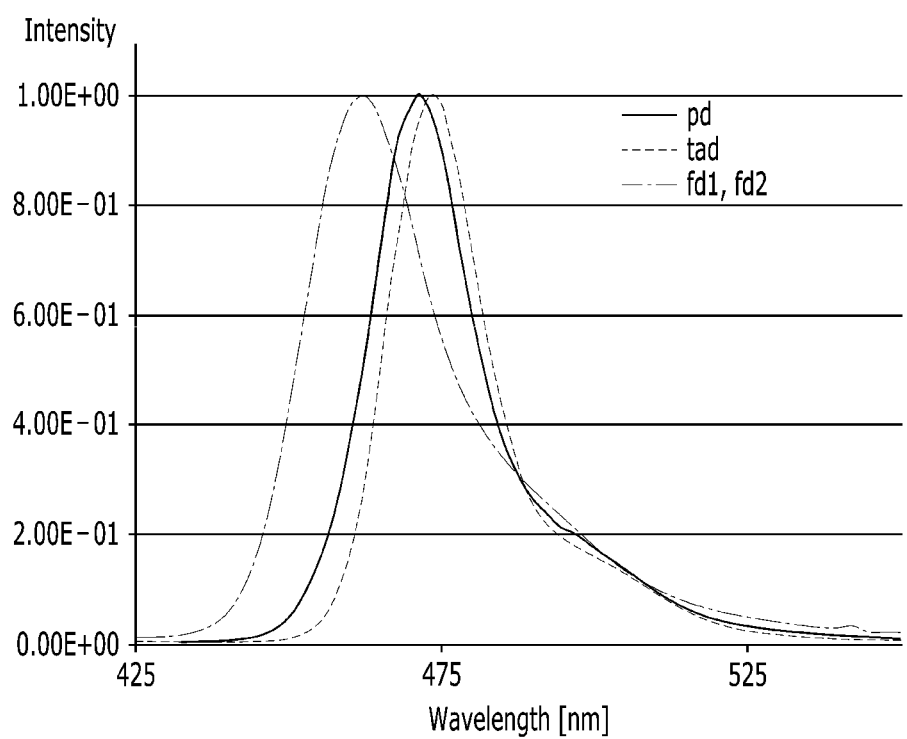
FIG. 2 is a graph showing PL properties of a fluorescent dopant, a thermally activated delayed fluorescence (TADF) dopant, and a phosphorescent dopant applied to first to third experimental examples.

FIG. 1 is a sectional view showing a light-emitting device according to a first embodiment of the present invention. FIG. 2 is a graph showing PL properties of a fluorescent dopant, a TADF dopant, and a phosphorescent dopant applied to a light-emitting device and a light-emitting display device according to the present invention.

As shown in FIG. 1, a light-emitting device 2000 according to the first embodiment of the present invention includes an anode 110 and a cathode 170 disposed on a substrate 100 so as to be opposite each other, a charge generation layer 130 disposed between the anode 110 and the cathode 170, a first stack S1 disposed between the anode 110 and the charge generation layer 130, and a second stack S2 disposed between the charge generation layer 130 and the cathode 170.

Each of the first stack S1 and the second stack S2 includes an emissive layer and common layers disposed on and under the emissive layer. The first stack S1 and the second stack S2 overlap each other in the same subpixel and are disposed at different vertical positions. Each emissive layer includes a host and a dopant. The host is the main material and is included so as to account for 50 wt % or more in each emissive layer. In the light-emitting device 2000 according to the present invention, dopants in different stacks exhibit different luminous properties, whereby lifespan and efficiency of the light-emitting device are simultaneously improved.

Specifically, the first stack S1 includes a hole injection layer 111, a first hole transport layer 112, a first emissive layer 1100, and a first electron transport layer 115. Here, the first emissive layer 1100 includes a first host h1 and a single first fluorescent dopant fd1 in the first host. The first fluorescent dopant fd1 can adjust the wavelength of color light that a singlet exciton generated as the result of recombination of a hole and an electron emits while lowering to ground state energy.

The second stack S2 includes a second hole transport layer 116, a second emissive layer 1200, and a second electron transport layer 118. The second emissive layer 1200 includes a second host h2 and a second fluorescent dopant fd2 and a non-fluorescent dopant nfd, such as a phosphorescent dopant pd or a thermally activated delayed fluorescence (TADF) dopant, in the second host. Both the second fluorescent dopant fd2 and the non-fluorescent dopant nfd emit the same color-based light (or the same color light) as the first fluorescent dopant fd1. For example, in the light-emitting device 2000 according to the present invention, color efficiency of light of a single predetermined fluorescent color of the first emissive layer 1100 of the first stack S1 is improved through a plural stack structure.

Here, the first and second fluorescent dopants fd1 and fd2 can be the same fluorescent dopants, but such is not required. In order to improve light efficiency of pure color, as shown in FIG. 2, the first and second fluorescent dopants fd1 and fd2 can be materials having the same emission peak properties and the same PL spectrum, but such is not required.

The "non-fluorescent dopant nfd" defined in the present invention can be a dopant having luminous properties of non-pure fluorescence, and can be, for example, a phosphorescent dopant or a thermally activated delayed fluorescence dopant.

For reference, there are a singlet exciton and a triplet exciton as examples of an exciton generated as the result of recombination of a hole and an electron. Fluorescence occurs when the singlet exciton participates in light emission, and phosphorescence occurs when the triplet exciton participates in light emission.

Electrons and holes injected to drive the light-emitting device are recombined to form an exciton. At this time, the exciton can be classified as a singlet exciton or a triplet exciton depending on the spin state thereof. Probabilistically, 25% of singlet excitons are formed, and 75% of triplet excitons are formed. Since a fluorescent dopant emits light using only singlet excitons, the maximum internal quantum efficiency thereof is limited to 25%, and 75% of triplet excitons disappear through various radiationless decay processes. A phosphorescent dopant additionally uses triplet excitons, which are not used by the fluorescent dopant, in a light emission process. Theoretically, the internal quantum efficiency thereof is greatly increased, whereby efficiency of the device itself can be maximized. In a phosphorescent dopant, however, excitation lifespan of the triplet excitons is long in the triplet excitation process, triplets that do not participate in light emission and disappear are generated due to triplet-triplet annihilation (TTA), and the excitation state is saturated. As a result, the luminous lifespan of a phosphorescence device including a single phosphorescent dopant is shorter than the luminous lifespan of a fluorescence including a single fluorescent dopant.

In a thermally activated delayed fluorescence dopant, a triplet exciton is capable of performing reverse intersystem crossing (RISC) from a triplet state (T1 level) to a singlet state (S1 level). Triplet excitons that are not used for phosphorescence emission are delayed through reverse intersystem crossing so as to be used for fluorescence emission. Direct fluorescence emission and delayed fluorescence emission of a singlet exciton are simultaneously possible.

The light-emitting device according to the present invention is applicable to for example, a blue light-emitting device that emits blue light. In the above, the efficiency of a phosphorescent dopant and a thermally activated delayed fluorescence dopant has been described as being higher than the efficiency of a fluorescent dopant. In various settings, it can be difficult to increase the lifespan of blue light-emitting materials to a predetermined level or more, compared to other color light-emitting materials. Particular, in an emissive layer including a blue phosphorescent dopant or a blue delayed fluorescence dopant, it is necessary to stably design a host having a higher triplet state than a dopant configured to be excited or transited from a triplet state. Since the blue phosphorescent dopant or the blue delayed fluorescence dopant has a higher triplet state than other color phosphorescence or delayed fluorescence dopants, it is difficult to design a host for a blue emissive layer, compared to other color emissive layers. In addition, a host having a high triplet state has a large HOMO-LUMO energy band gap. In this case, electron and hole transport ability is lowered. As a result, stability of light-emitting devices including a blue phosphorescent dopant or a blue delayed fluorescence dopant as a single emissive dopant is lowered over time.

In particular, the light-emitting device 2000 according to the present invention includes the first fluorescent dopant fd1, the lifespan of which can be increased to a predetermined level or more, in the first emissive layer 1100 of the first stack S1 as a single emissive dopant, and includes the second fluorescent dopant fd2 and the non-fluorescent dopant nfd in the second emissive layer 1200 of the second stack S2 in order to improve efficiency together with lifespan.

As an example, the non-fluorescent dopant nfd in the second emissive layer 1200 can be one that is not included or is lacking in the first emissive layer 1100. In one or more embodiments, when provided with two of more stacks, one of the stacks can include the non-fluorescent dopant nfd, while the other stack or stacks do not include or lack the non-fluorescent dopant nfd.

The first fluorescent dopant fd1 of the first emissive layer 1100 and the second fluorescent dopant fd2 of the second emissive layer 1200, which have the same emission peak or an emission peak difference of less than 5 nm, emit almost the same color light. Depending on circumstances, the first and second fluorescent dopants fd1 and fd2 can be the same material.

In the second emissive layer 1200, the second fluorescent dopant fd2 and the non-fluorescent dopant nfd, such as a phosphorescent dopant or thermally activated delayed fluorescence dopant, are used together in light emission. In this case, the first and second hosts h1 and h2 included in the first and second emissive layers 1100 and 1200 can transfer energy while the PL spectra thereof, which have absorption properties, overlap emissive PL spectra of the first and second fluorescent dopants fd1 and fd2. In the case in which the triplet state (triplet energy level T1) of the second host h2 of the second emissive layer 1200 is higher than that of the phosphorescent dopant pd or the thermally activated delayed fluorescence dopant tad, emission of the phosphorescent dopant pd or the thermally activated delayed fluorescence dopant tad as the non-fluorescent dopant nfd can directly transmit energy to the phosphorescent dopant pd. Consequently, the second host h2 can be selected from a material having a Pt spectrum, which has an absorption property, overlapping the Pt spectrum of the second fluorescent dopant fd2, which has an emission property, and having a higher triplet state than the non-fluorescent dopant nfd.

Depending on circumstances, the second host h2 can include two or more different kinds of ingredients such that the second fluorescent dopant fd2 and the non-fluorescent dopant nfd participate in excitation in the second emissive layer 1200.

In the second emissive layer 1200, the second host h2 can be included as one or more kinds. Even in the case in which the second host h2 is constituted so as Lo be included as plurality kinds, the second host h2 included so as to account for 50 wt % or more. Consequently, the second fluorescent dopant fd2 and the non-fluorescent dopant nfd can be included so as to account for less than 50 wt %, preferably 40 wt % or less, more preferably 30 wt % or less.

The first host h1 included in the first emissive layer 1100 can be constituted by a single ingredient, or two or more kinds of hosts having different hole and electron mobilities in order to improve electron and hole transportability can be included. In the first emissive layer 1100, the first fluorescent dopant fd1 can be included so as to account for preferably 40 wt % or less, more preferably 30 wt % or less.

Each of the first and second fluorescent dopant fd1 and fd2 can be an organic compound having boron as a core, and can be a compound represented by Chemical Formulas 1 to 3, for example, as a blue fluorescent dopant.

[Chemical Formula 1]

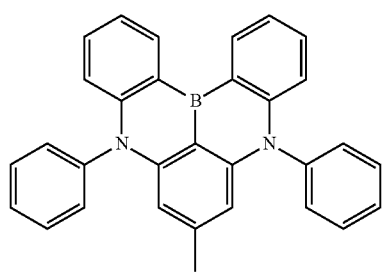

[Chemical Formula 2]

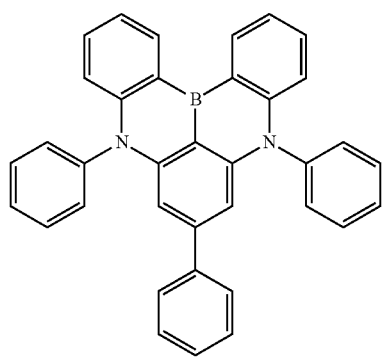

[Chemical Formula 3]

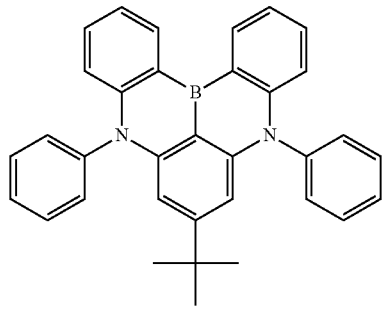

A non-fluorescent dopant included in the second emissive layer 1200 can be a compound having a heavy metal as a core represented by Chemical Formulas 4 to 6 as an example of a blue phosphorescent dopant. In the presented examples, iridium (Ir) is used as the heavy metal. However, the present invention is not limited thereto. An example of a heavy metal element can be a metal complex compound including iridium (Ir), platinum (Pt), osmium (Os), gold (Au), titanium (Ti), zirconium (Zr), hafnium (Hf), europium (Eu), terbium (Tb), palladium (Pd), or thulium (Tm). However, the present invention is not limited thereto. The heavy metal element can be changed to another core heavy metal as needed.

[Chemical Formula 4]

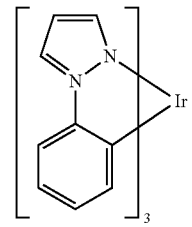

[Chemical Formula 5]

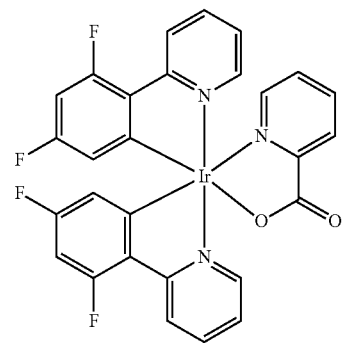

[Chemical Formula 6]

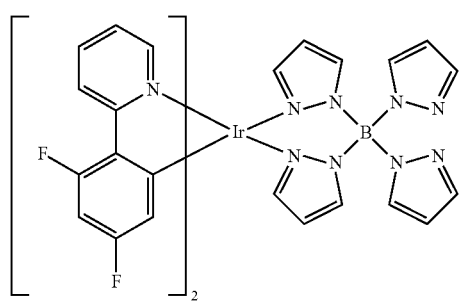

In addition, a non-fluorescent dopant can be a compound represented by Chemical Formulas 7 to 9 as an example of a blue delayed phosphorescent dopant, which is a modification of a phosphorescent dopant. The blue delayed phosphorescent dopant is a polymer compound having boron as core and further having a substituent, such as an alkyl group, at a distal end thereof, compared to the above-described blue fluorescent dopant, and satisfies a condition in which a singlet state and a triplet state have a predetermined value, e.g., 0.4 eV or less. The presented example is merely an example, and any material capable of achieving delayed phosphorescence together with a phosphorescent dopant in the same emissive layer can be used.

[Chemical Formula 7]

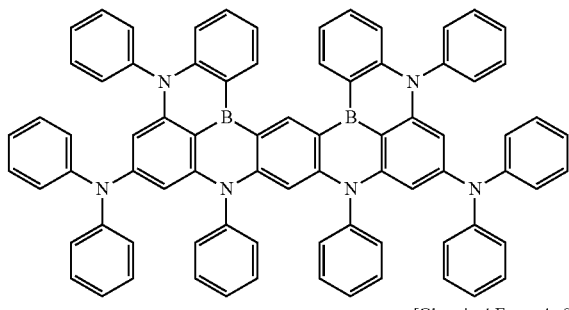

[Chemical Formula 8]

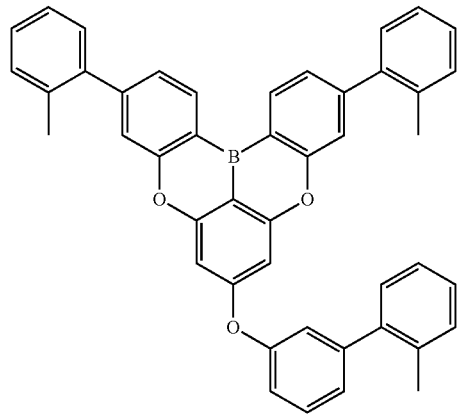

[Chemical Formula 9]

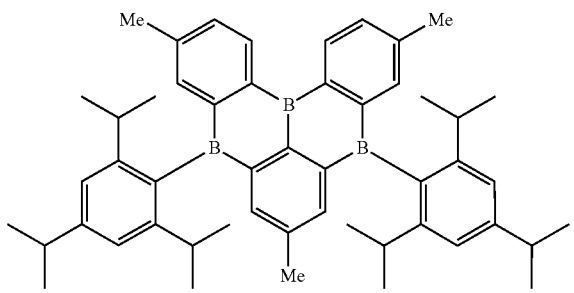

A phosphorescent dopant or a thermally activated delayed fluorescence dopant, as a single material that emits blue light, uses a triplet exciton in light emission in addition to a singlet exciton, compared to a fluorescent dopant, whereby efficiency is high. As described above, however, the lifespan of the phosphorescent dopant and the thermally activated delayed fluorescence dopant is limited as a single emissive material. In the light-emitting device 2000 according to the present invention, the second emissive layer 1200 of the second stack S2 includes a second fluorescent dopant fd2 together with a phosphorescent dopant d or a thermally activated delayed fluorescence dopant tad, whereby lifespan can be increased through fluorescence emission due to continuous excitation of a singlet exciton, and efficiency can be improved through emission of a triplet exciton and reverse intersystem crossing from a triplet state to a singlet state.

The non-fluorescent dopant, such as the phosphorescent dopant pd or the thermally activated delayed fluorescence dopant tad, used in the present invention has a longer wavelength than the first and second fluorescent dopants fd1 and fd2, as shown in FIG. 2. In the emission peak thereof, the non-fluorescent dopant has a longer wavelength by 1 nm to 30 nm than the first and second fluorescent dopants fd1 and fd2.

Meanwhile, in the light-emitting device according to the present invention, light emitted from the first and second emissive layers 1100 and 1200 of the first and second stacks S1 and S2 is resonated while being repeatedly reflected and re-reflected between the anode 110 and the cathode 170 and finally exits through the cathode 170. Light emitted from the first and second emissive layers 1100 and 1200 is the same color-based light (or the same color light). Since light generated in two stacks is summed and exits through the cathode 170, efficiency of the same color-based light (or the same color light) can be improved, compared to a single stack.

The examples presented in FIG. 2 are PL emission spectra of the first and second fluorescent dopants fd1 and fd2, the phosphorescent dopant pd, and the thermally activated delayed fluorescence dopant tad used in the following experimental examples. Each of the first and second fluorescent dopants fd1 and fd2, the phosphorescent dopant pd, and the thermally activated delayed fluorescence dopant tad emits blue light. In the case in which the light-emitting device of FIG. 1 using such dopants is realized, the lifespan of blue can be increased to a predetermined level or more through the first emissive layer, which has a single fluorescent dopant, and the phosphorescent dopant OE the thermally activated delayed fluorescence dopant emits light together with the second fluorescent dopant in the second emissive layer, whereby blue emission efficiency is improved, whereby lifespan and emission efficiency can be simultaneously improved. The concrete effects of the light-emitting device will be described below with reference to the following experiments.

The example of FIG. 2 shows an example of a blue emissive dopant. However, in the case in which a different color emissive dopant is configured such that an emissive layer having only a fluorescent dopant is provided in the first stack and a non-pure fluorescent dopant, such as a phosphorescent dopant or a thermally activated delayed fluorescence dopant, is included in the second stack together with a fluorescent dopant, as in the structure of the light-emitting device described above, both efficiency and lifespan can be improved, compared to a structure having a fluorescent dopant of a different stack structure.

The reason that a blue emissive dopant is presented by way of example in FIG. 2 is that a structure having a blue emissive layer has lower lifespan and efficiency than a red emissive layer or a green emissive layer, and therefore the example of FIG. 2 is presented as an example for solving this.

Since visibility is reduced at the time of blue light emission, high intensity of an EL spectrum is required, compared to other color light emission. Consequently, the blue emissive layer requires higher intensity of an EL spectrum than other colors at the time of realization of white light. As a result, the lifespan of the blue emissive dopant tends to be lower than dopants of other color emissive layers at the time of driving. Both the lifespan and efficiency of the light-emitting device according to the present invention are improved by the provision of a dual stack structure including first and second stacks and different emissive layers in two stacks. The first and second emissive layers 1100 and 1200 of the first and second stacks S1 and S2, which overlap each other, are materials that emits the same color-based light (or the same color light), although there is a small difference in emission peak. The first and second emissive layers 1100 and 1200 of the first and second stacks S1 and S2 emit light in a supplementary state.

In the first and second emissive layers 1100 and 1200, each of the first host h1 and the second host h2 can be a single material, or can include a plurality of materials having different properties as needed.

Meanwhile, the structure of FIG. 1 other than the emissive layers will be described.

The hole injection layer 111 is formed of a material that receives a little energy barrier or acts as a lower barrier as compared to the anode 110 and has lower surface resistance such that injection of a hole from the anode 110 is easily performed. To this end, a p-type dopant can be included in a hole transport material.

Each of the first hole transport layer 112 and the second hole transport layer 116 can easily transport a hole supplied through the hole injection layer 111 or the charge generation layer 130 to the first emissive layer 1100 or the second emissive layer 1200, and is made of a hole transport material.

Each of the first and second electron transport layers 115 and 118 is a layer for transporting an electron to a corresponding one of the first emissive layer 1100 and the second emissive layer 1200, and includes an electron transport material.

Meanwhile, as needed, a first or second electron blocking layer 113 or 142 for preventing an electron or exciton from exiting from a corresponding emissive layer can be further provided between the first hole transport layer 112 and the first emissive layer 1100 or between the second hole transport layer 116 and the second emissive layer 1200, and hole blocking layers 114 and 117 for preventing holes from exiting from the corresponding emissive layers can be further provided between the first emissive layer 1100 and the first electron transport layer 115 and between the second emissive layer 1200 and the second electron transport layer 118.

An electron injection layer 160 is further included between the cathode 170 and the second electron transport layer 118. The electron injection layer 160 is a layer that functionally assists in injection of an electron from the cathode 170 to an internal organic material. To this end, an inorganic compound, such as LiF or MgF, an alkaline metal, such as Li, an alkaline earth metal, such as Ca, a transition metal, such as Yb, or a metal constituting the cathode 170 can be further included. The electron injection layer 160 is a metal or a metal compound in terms of material, and can form the same chamber together with the cathode 170. Consequently, the electron injection layer 160 can be referred to as a cathode sub metal or a cathode metal.

Hereinafter, a light-emitting display device according to the present invention configured such that the light-emitting device of FIG. 1 is provided as a blue subpixel and emissive layers having the same luminous properties are provided for a red subpixel and a green subpixel will be described by way of example.

Figure 3:
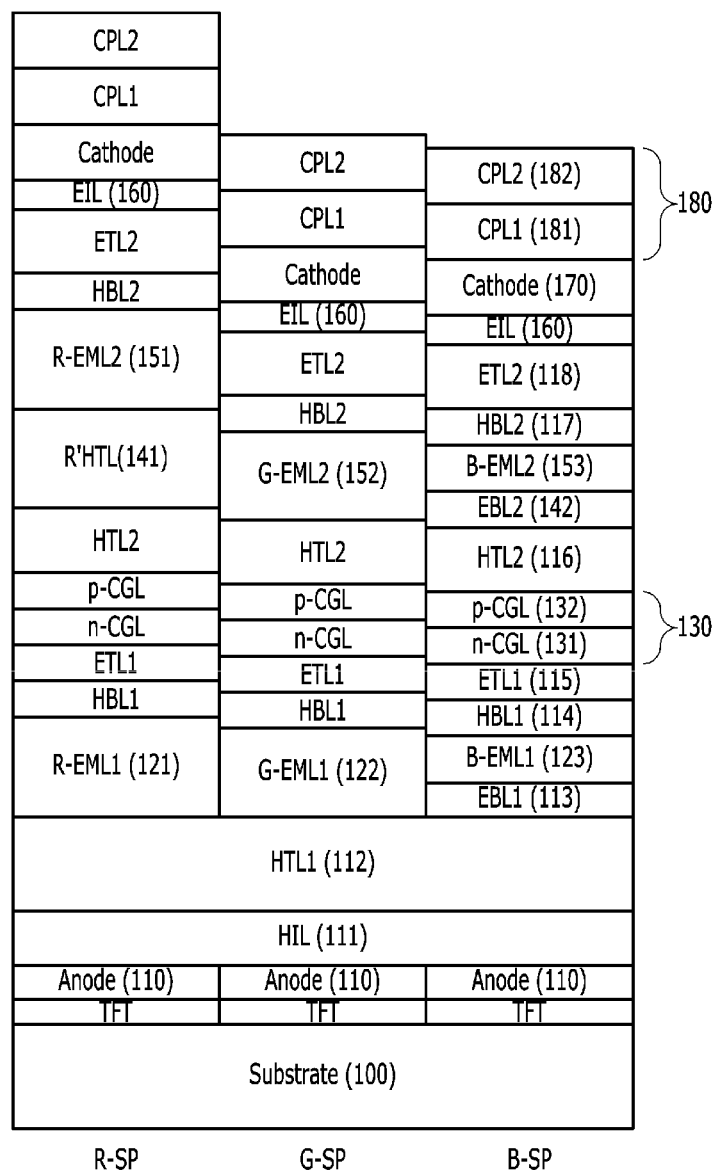
FIG. 3 is a sectional view showing an example of a light-emitting display device according to the present invention to which the structure of FIG. 1 is applied.

FIG. 3 is a sectional view showing an example of a light-emitting display device according to the present invention. All the components of the light-emitting display device according to all embodiments of the present disclosure are operatively coupled and configured.

As shown in FIG. 3, a light-emitting display device 4000 according to the present invention includes a substrate 100 having first to third subpixels B-SP, G-SP, and R-SP, a thin film transistor TFT provided in each subpixel, an anode 110 connected to the thin film transistor TFT, the anode being provided in each of the first to third subpixels B-SP, G-SP, and R-SP, a cathode 170 opposite the anode 110, the cathode being provided in each of the first to third subpixels B-SP, G-SP, and R-SP, a charge generation layer 130 between the anode and the cathode, a first stack S1 located in each of the first to third subpixels B-SP, G-SP, and R-SP between the anode 110 and the charge generation layer 130, and a second stack S2 located in each of the first to third subpixels B-SP, G-SP, and R-SP between the charge generation layer 130 and the cathode 170.

A hole injection layer 111, a first hole transport layer 112, a first hole blocking layer 114, a first electron transport layer 115, and a charge generation layer 130 of the first stack S1 and a second hole transport layer 116, a second hole blocking layer 117, and a second electron transport layer 118 of the second stack S2 are common layers formed over the first to third subpixels B-SP, G-SP, and R-SP. The common layers, the electron injection layers 160, and the cathodes 170 are formed over the display region of the substrate 100 as individuals, and can be formed without microscopic metal masks.

In addition, the charge generation layer 130 can be constituted by stacking an n-type charge generation layer 131 and a p-type charge generation layer 132, as shown in FIG. 3, or can be constituted as a single layer, in which an n-type dopant and a p-type dopant can be included. Depending on circumstances, the charge generation layer can be constituted as three or more layers having different ingredients.

In the first to third subpixels B-SP, G-SP, and R-SP, the first and second stacks S1 and S2, particularly emissive layers thereof, are different in construction from each other. In the second subpixel G-SP, each stack includes a green emissive layer. In the third subpixel R-SP, each stack includes a red emissive layer.

In the light-emitting display device of FIG. 3, color-based optical distances are different from each other due to different thicknesses of the emissive layers and by the provision of a hole transport assistance layer. For red light, which has a relatively large optical distance, the thickness of each of first and second red emissive layers 121 and 151 of the third subpixel R-SP is greater than the thickness of each of first and second blue emissive layers 123 and 153 of the first subpixel B-SP and is also greater than the thickness of each of the first and second green emissive layers 122 and 152 of the second subpixel G-SP.

Meanwhile, a hole transport assistance layer 141 is further provided under the second red emissive layer 151. Since there is a limit in increasing the thicknesses of the first and second red emissive layers 121 and 151 in terms of material and process and an emissive region of the red emissive layer is actually formed in only a portion of the thickness of the red emissive layer, the thickness of the first red emissive layer 121 is formed so as to be greater than the thicknesses of the first green emissive layer 122 and the first blue emissive layer 123, whereby the thickness of the first red emissive layer 121 in the first stack S1 is adjusted. In the second stack S2, the thickness of the second red emissive layer 151 is formed so as to be equal to the thickness of the first red emissive layer 121, and the hole transport assistance layer 141 is further provided under the second red emissive layer 151, whereby the optical distance necessary for red emission in the second stack S2 is adjusted. Here, the hole transport assistance layer 141 can be formed using the same chamber and/or the same mask as the second red emissive layer 151, and can be formed of a different material that is supplied before formation of the second red emissive layer 151.

In the first subpixel B-SP, first and second electron blocking layers 113 and 142 can be further included under the first and second blue emissive layers 123 and 153, respectively. The reason that the first and second electron blocking layers 113 and 142 are further included in the first subpixel B-SP is that the thickness of the emissive layer is less than other subpixels. For example, in the first subpixel B-SP, an emissive region generated as the result of recombination of a hole and an electron is concentrated on the lower surfaces of the first and second blue emissive layers 123 and 153. As a result, an exciton or an electron tends to move downwards from the first and second blue emissive layers 123 and 153. In order to prevent this, the first and second electron blocking layers 113 and 142 are further provided under the first and second blue emissive layers 123 and 153, respectively.

Also, in the first subpixel B-SP, the first blue emissive layer 123 of the first stack S1 has a first host h1 and a first fluorescent dopant fd1, as described with reference to FIGS. 1 and 2. The second blue emissive layer 153 of the second stack S2 has a second host h2, a second fluorescent dopant fd2, and a non-fluorescent dopant nfd. Each of the first fluorescent dopant fd1, the second fluorescent dopant fd2, and the non-fluorescent dopant nfd can have an emission peak at a wavelength of 435 nm to 490 nm.

Here, the non-fluorescent dopant nfd can be a phosphorescent dopant pd or a thermally activated delayed fluorescence dopant tad.

The first and second blue emissive layers 123 and 153 emit the same blue-based light.

In the second subpixel G-SP, the first and second green emissive layers 122 and 152 of the first and second stacks S1 and S2 include hosts and dopants having the same luminous properties. For example, the first and second green emissive layers can be emissive layers having the same fluorescence properties or the same phosphorescence properties. Each of the first and second green emissive layers 122 and 152 can have an emission peak at a wavelength of 510 nm to 590 nm.

In the third subpixel R-SP, the first and second red emissive layers 121 and 151 of the first and second stacks S1 and S2 include hosts and dopants having the same luminous properties. For example, the first and second red emissive layers can be emissive layers having the same fluorescence properties or the same phosphorescence properties. The first and second red emissive layers 121 and 151 can have fifth and sixth emissive layers each having an emission peak at a wavelength of 600 nm to 650 nm.

In the following experimental examples, the light-emitting display device according to the present invention was configured such that the first and second red emissive layers 121 and 151 and the first and second green emissive layers 122 and 152 are constituted by a phosphorescent emissive layer, the first blue emissive layer 123 is constituted by a fluorescent emissive layer, and the second blue emissive layer 153 is constituted by an emissive layer having fluorescence and phosphorescence or delayed fluorescence, whereby it can be seen that each color light had equal effects in expressing white light.

Meanwhile, the anode 110 is connected to the thin film transistor TFT provided in each of the subpixels B-SP, G-SP, and R-SP on the substrate 100, and can be driven for each subpixel.

A capping layer 180 configured to protect the light-emitting device and to improve light exit efficiency is provided on the cathode 170. The capping layer 180 can be constituted by stacking, for example, an organic capping layer 181 and an inorganic capping layer 182. However, the present invention is not limited thereto. The capping layer can have a single layer or a structure in which a plurality of layers having different refractive indices is stacked.

Hereinafter, efficiency and lifespan properties will be described for each experimental example, whereby the meaning of the light-emitting device according to the present invention will be described.

First, a single stack structure, which is compared to a plural stack structure of the light-emitting device according to the present invention, will be described.

Figure 4:
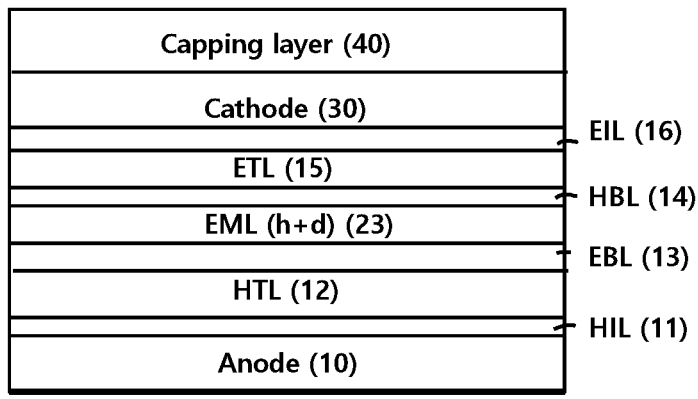
FIG. 4 is a sectional view showing a light-emitting device according to each of first to third experimental examples.
Figure 5:
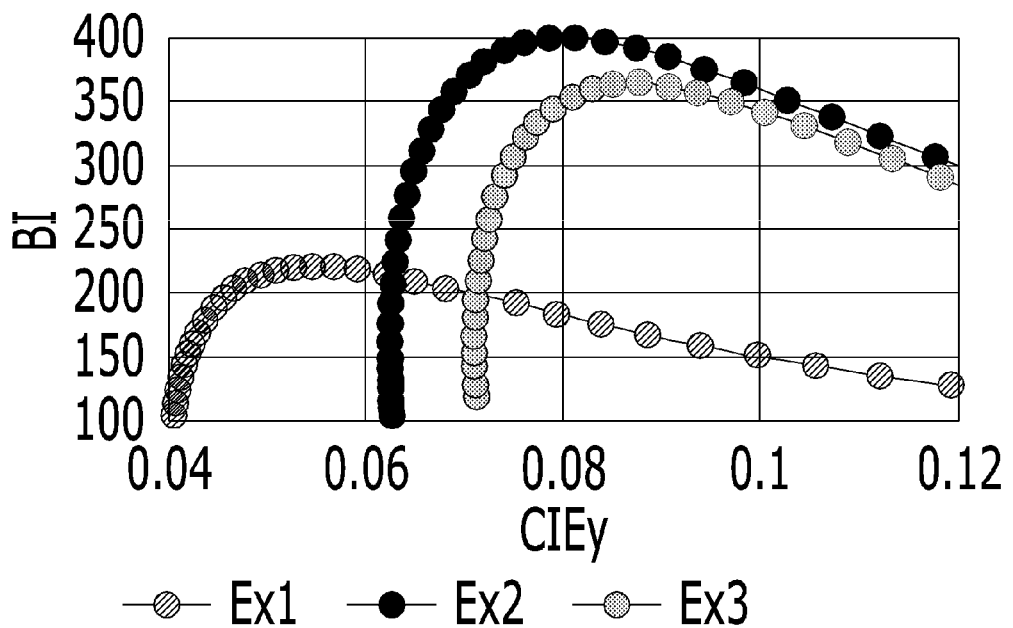
FIG. 5 is a graph showing a CIEy-BI relationship of each of the first to third experimental examples.

FIG. 4 is a sectional view of a light-emitting device according to each of first to third experimental examples, and FIG. 5 is a graph showing a CIEy-BI relationship of each of the first to third experimental examples.

As shown in FIG. 4, the light-emitting device according to each of the first to third experimental examples Ex1, Ex2, and Ex3 has a structure in which a hole injection layer 11, a hole transport layer 12, an electron blocking layer 13, a blue emissive layer 23, a hole blocking layer 14, an electron transport layer 15, and an electron injection layer 16 are disposed between an anode 10 and a cathode 30. A capping layer 40 can be included on the cathode 30.

The light-emitting device of FIG. 4 is different from the light-emitting device of FIG. 1 in that a single stack is provided.

In the first experimental example Ex1, the blue emissive layer 23 has a host and a single fluorescent dopant. In the second experimental example Ex2, the blue emissive layer 23 has a host and a single phosphorescent dopant. In the third experimental example Ex3, the blue emissive layer 23 has a host and a single thermally activated delayed fluorescence dopant

TABLE 1

| Properties | | Ex1 | Ex2 | Ex3 |
|---|---|---|---|---|
| Color coordinates | CIEy at BI max | 0.053 | 0.081 | 0.088 |
| BI | | 220.8 | 399.3 | 363.6 |
| Efficiency | Efficiency compared to Ex1 (%) | 100 | 181 | 165 |
| Lifespan | T95 (hrs) | 400 | 50 | 180 |
| | Lifespan compared to Ex1 (%) | 100 | 12.5 | 45 |

In the light-emitting device of FIG. 4, the first to third experimental examples Ex1, Ex2, and Ex3 are identical in structure to each other except that the emissive layers of the first to third experimental examples have a blue fluorescent dopant fd, a blue phosphorescent dopant pd, and a blue thermally activated delayed fluorescence dopant tad, respectively. In Table 1, the blue index BI is a value obtained by dividing the efficiency of each experimental example by the CIEy value. In general, a large value means high efficiency, but it does not mean that a large value is necessarily excellent. CIEy expresses a pure color. In the case in which CIEy is lower, it is possible to reproduce a purer blue color. In the display device, a CIEy color coordinate value of 0.070 or less is required for pure blue efficiency.

As shown in Table 1 and FIG. 5, efficiencies of the second and third experimental examples Ex2 and Ex3 are 181% and 165% of that of the first experimental example Ex1, respectively, which are high efficiencies. However, the CIEy color coordinates of the first to third experimental examples EX1, Ex2, and Ex3 under the conditions having the maximum blue indices BI are 0.053, 0.081, and 0.088, respectively. The second and third experimental examples Ex2 and Ex3 have high efficiencies, whereby the blue indices are high, but the CIEy values exceed 0.070. This means that it is difficult to reproduce a pure blue color in the second and third experimental examples Ex2 and Ex3.

In addition, it can be seen that the lifespan of the first experimental example Ex1 using the blue fluorescent dopant is 8 times or 2.2 times the case in which the blue phosphorescent dopant or the thermally activated delayed fluorescence dopant is used, i.e., the lifespan of the first experimental example is excellent.

In comparison between the first to third experimental examples EX1, Ex2, and Ex3, the phosphorescent dopant or the thermally activated delayed fluorescence dopant has excellent efficiency in the single stack structure for at least blue emission. However, reproduction of color purity suitable for the display device is lowered, and it is difficult to increase lifespan to a predetermined level or more.

Hereinafter, experimental examples each having a plurality of stacks applied thereto configured such that blue emissive layers of first and second stacks are different in construction from each other will be described. Each light-emitting device has the structure of the device described with reference to FIG. 1.

Figure 6:
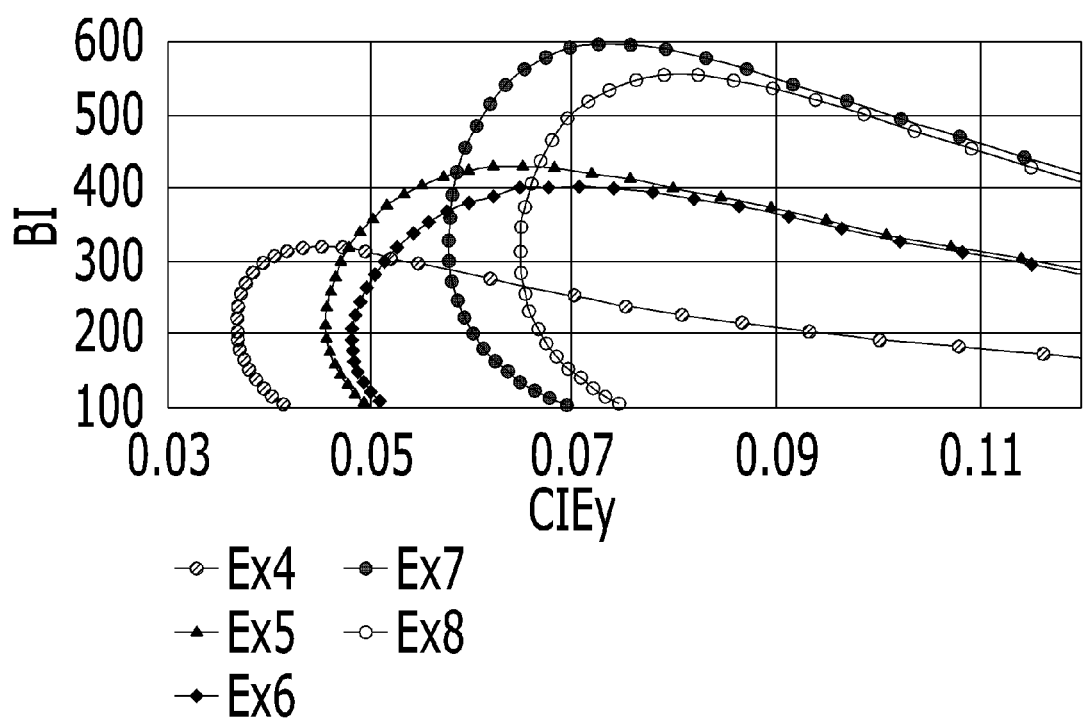
FIG. 6 is a graph showing a CIEy-BI relationship according to each of fourth to eighth experimental examples.

FIG. 6 is a graph showing a CIEy-BI relationship according to each of fourth to eighth experimental examples.

In the same manner as in FIG. 1, the light-emitting devices of the fourth to eighth experimental examples are identical in construction to each other except for emissive layers 1100 and 1200 of first and second stacks.

For example, the fourth experimental example Ex4 was configured such that a first blue emissive layer of the first stack S1 includes a first host h1 and a fluorescent dopant fd1 and such that a second blue emissive layer of the second stack S2 includes a first host h1 and a second fluorescent dopant fd2 in the same manner as the first blue emissive layer. The fluorescent dopants fd1 and fd2 of the first and second blue emissive layers were constituted by the same blue fluorescent dopants.

The fifth experimental example Ex5 was configured such that a first blue emissive layer of the first stack S1 includes a first host h1 and a fluorescent dopant fd1 and such that a second blue emissive layer of the second stack S2 includes a second host h2, a second fluorescent dopant fd2, and a phosphorescent dopant pd.

The sixth experimental example Ex6 was configured such that a first blue emissive layer of the first stack S1 includes a first host h1 and a fluorescent dopant fd1 and such that a second blue emissive layer of the second stack S2 includes a second host h2, a second fluorescent dopant fd2, and a thermally activated delayed fluorescence dopant tad.

The seventh experimental example Ex7 was configured such that a first blue emissive layer of the first stack S1 includes a first host h4 and a first phosphorescent dopant pd1 and such that a second blue emissive layer of the second stack S2 includes a first host h4 and a second phosphorescent dopant pd2 in the same manner as the first blue emissive layer. The phosphorescent dopants pd1 and pd2 of the first and second blue emissive layers were constituted by the same blue phosphorescent dopants.

The eighth experimental example Ex8 was configured such that a first blue emissive layer of the first stack S1 includes a first host h5 and a first thermally activated delayed fluorescence dopant tad1 and such that a second blue emissive layer of the second stack S2 includes a first host h5 and a second thermally activated delayed fluorescence dopant tad2 in the same manner as the first blue emissive layer. The thermally activated delayed fluorescence dopants tad1 and tad2 of the first and second blue emissive layers were constituted by the same blue thermally activated delayed fluorescence dopants.

TABLE 2

| Classification | | Ex4 | Ex5 | Ex6 | Ex7 | Ex8 |
|---|---|---|---|---|---|---|
| EML structure | B-EML2 (S2) | h1 + fd2 | h2 + fd2 + pd | h3 + fd2 + tad | h4 + pd2 | h5 + tad2 |
| | B-EML1 (S1) | h1 + fd1 | h1 + fd1 | h1 + fd1 | h4 + pd1 | h5 + tad1 |
| Color coordinates (CIEy at BI max) | | 0.045 | 0.065 | 0.070 | 0.073 | 0.082 |
| Efficiency | BI | 319 | 430 | 400 | 595 | 555 |
| | Compared to Ex4 (%) | 100 | 135 | 125 | 187 | 174 |
| Lifespan | Compared to Ex1 (%) | — | 60 | 105 | 27.5 | 90 |

As shown in Table 2 and FIG. 6, in the fourth experimental example Ex4 including pure fluorescent emissive layers having a two-stack structure, the CIEy color coordinate value is reduced, whereby blue reproduction rate is increased, and therefore efficiency is improved, compared to the single blue fluorescent emissive layer structure of the first experimental example Ex1, but efficiency is lower by 25% of more, compared to the other experimental examples.

In the fifth and sixth experimental examples Ex5 and Ex6, the first blue emissive layer 1100 of the first stack includes a single first blue fluorescent dopant fd1 as an emissive material, and the second blue emissive layer 1200 of the second stack includes a phosphorescent dopant pd or a thermally activated delayed fluorescence dopant tad together with a second blue fluorescent dopant fd2 as an emissive material. In this case, the CIEy value is 0.070 or less, whereby pure blue expression is possible, and the efficiency is 125% of that of the fourth experimental example Ex4. Consequently, it can be seen that pure blue expression is possible and efficiency is also improved. In addition, it can be seen that the fifth experimental example Ex5 and the sixth experimental example Ex6 have efficiencies of 60% and 105% of that of the first experimental example Ex1, the lifespan of which is excellent in the single stack structure, and therefore lifespan is also increased.

The lifespan of the fifth experimental example Ex5 is 60% of that of the first experimental example Ex1, and the efficiency thereof expressed by the blue index is 430, which is about 1.95 times 220.8 of the first experimental example Ex1. In the fifth experimental example Ex5, it is possible to reduce driving voltage due to increased efficiency thereof. For example, in the first experimental example Ex1 and the fifth experimental example Ex5, times at which luminance becomes 95% of the initial luminance at the same current density are measured and compared. When driving times of the fifth experimental example Ex5 and the first experimental example Ex1 at the same luminance are measured and compared with each other, the driving time of the fifth experimental example Ex5 is 1.17 times that of the first experimental example Ex1, and therefore a meaningful result can be expected in terms of lifespan when an actual display device is realized.

The lifespan of the sixth experimental example Ex6 is 105% of that of the first experimental example Ex1, and the blue index efficiency thereof is 400, which is 181% of the blue index efficiency of the first experimental example Ex1. The sixth experimental example Ex6 has meaningful results in terms of both lifespan and efficiency. Of course, when driving times of the sixth experimental example and the first experimental example at the same luminance are measured, the driving time of the sixth experimental example is 1.90 times that of the first experimental example, whereby the lifespan of the sixth experimental example is higher than that of the first experimental example.

Meanwhile, the CIEy value of each of the seventh experimental example Ex7, in which only the phosphorescent emissive layers are realized in the plural stack structure, and the eighth experimental example, in which only the thermally activated delayed fluorescence emissive layers are realized in the plural stack structure, is 0.073 or more, and therefore it can be seen that pure blue reproduction is difficult.

The light-emitting device according to the first embodiment of the present invention uses the structure of each of the fifth and sixth experimental examples.

Hereinafter, a second embodiment of the present invention, in which the structure of a second stack is changed, will be described.

Figure 7:
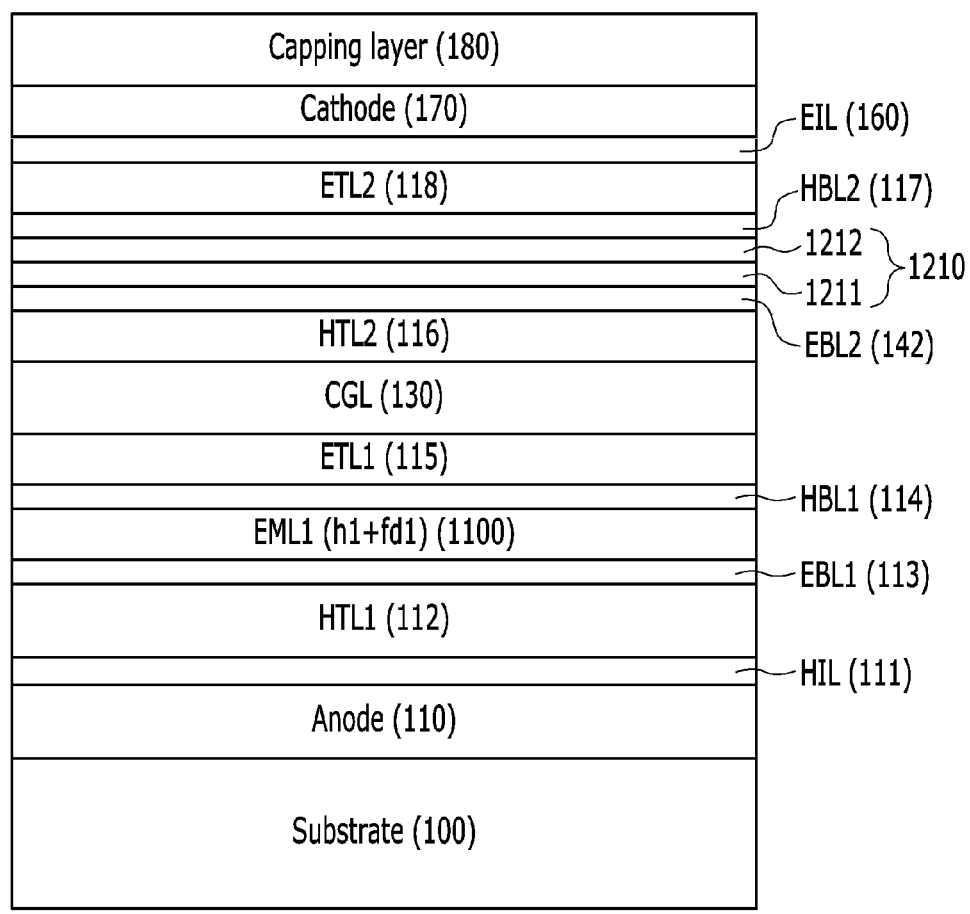
FIG. 7 is a sectional view showing a light-emitting device according to a second embodiment of the present invention.
Figure 8:
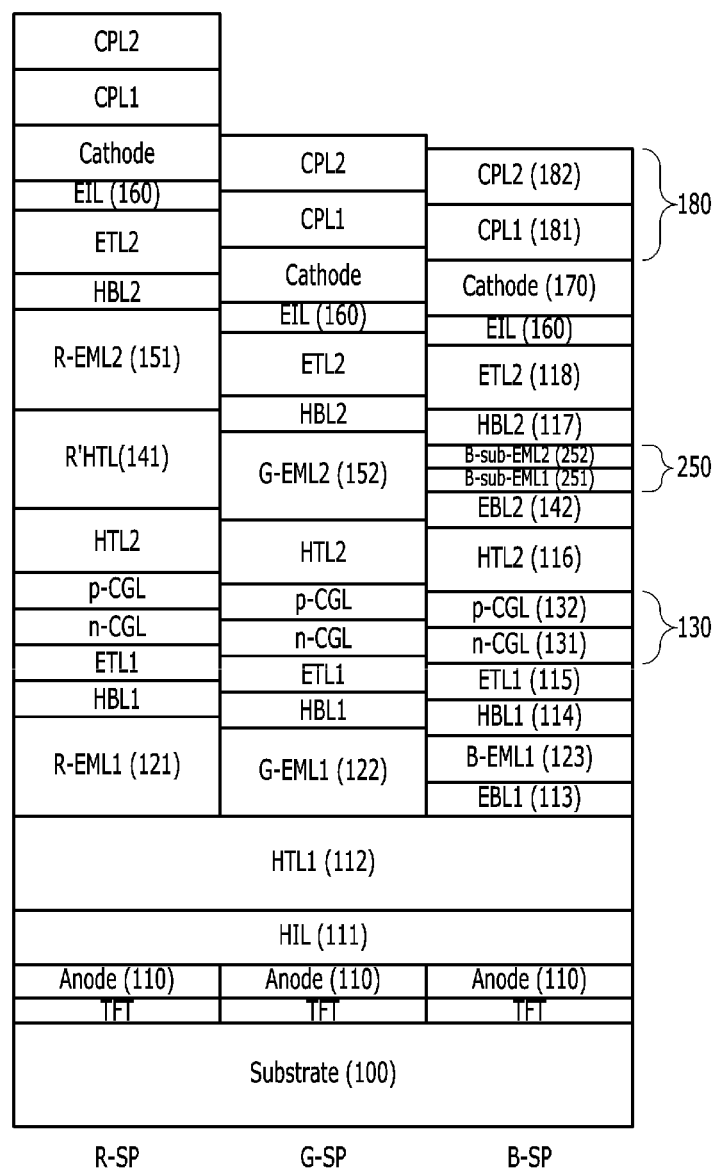
FIG. 8 is a sectional view showing a light-emitting display device according to the present invention to which the structure of FIG. 7 is applied.
Figure 9:
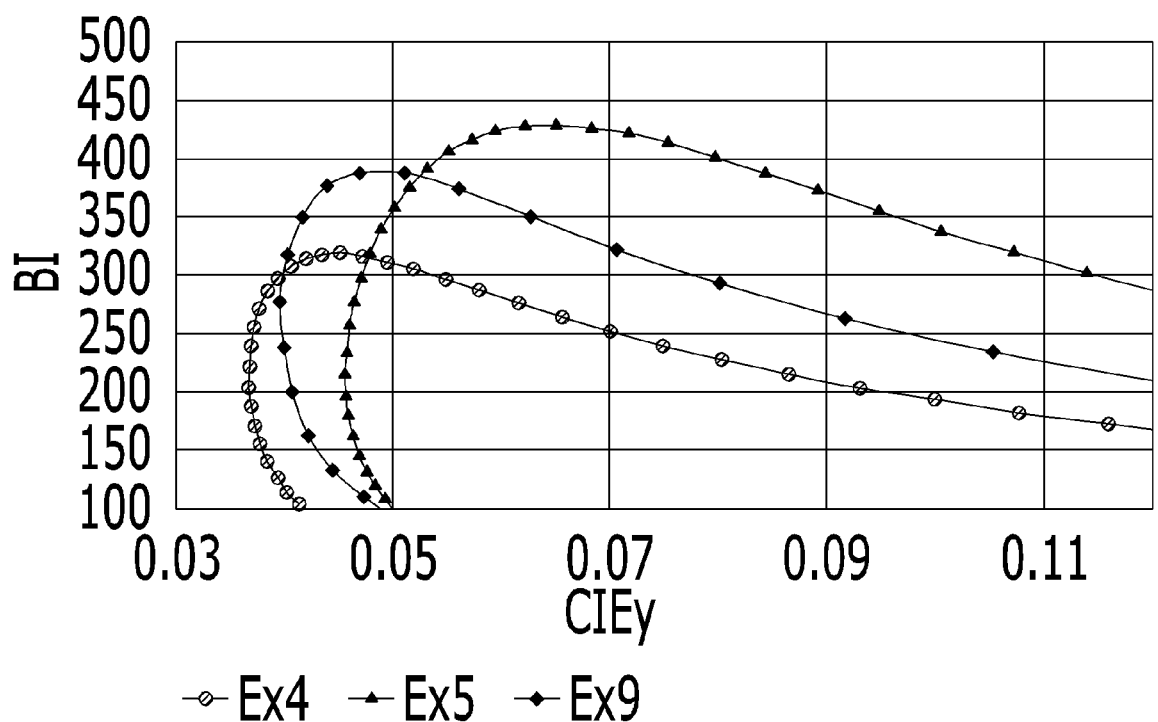
FIG. 9 is a graph showing a CIEy-BI relationship according to each of fourth, fifth, and ninth experimental examples.

As an example, FIG. 7 is a sectional view showing a light-emitting device according to the second embodiment of the present invention. FIG. 8 is a sectional view showing a light-emitting display device having the structure of FIG. 7. FIG. 9 is a graph showing a CIEy-BI relationship according to each of fourth, fifth, and ninth experimental examples.

As shown in FIG. 7, a light-emitting device 3000 according to the second embodiment of the present invention is configured such that a first stack S1 has the same structure as the light-emitting device of FIG. 1, i.e., the first stack includes a first emissive layer 1100 having a first host h1 and a first fluorescent dopant fd1, and a second emissive layer 1210 of a second stack S2 includes a first sub emissive layer 1211 having a second host h2 and a second fluorescent dopant fd2 and a second sub emissive layer 1212 having a third host h3 and a non-fluorescent dopant nfd.

The non-fluorescent dopant nfd can be a phosphorescent dopant or a thermally activated delayed fluorescence dopant.

The thickness of the second emissive layer 1210 constituted by stacking the first and second sub emissive layers 1211 and 1212 is similar to the thickness of the first emissive layer 1100 of the first stack S1. In this case, the non-fluorescent dopant, i.e., the phosphorescent dopant or the thermally activated delayed fluorescence dopant, in the second sub emissive layer 1212 participates in light emission, and some energy is transmitted to the first sub emissive layer 1211 thereunder in order to improve fluorescence efficiency of the first sub emissive layer 1211.

FIG. 8 shows a light-emitting display device 5000 including the structure of the light-emitting device 3000 in FIG. 7.

A first subpixel B-SP emitting blue light has the stack structure of FIG. 7, and each of a second subpixel G-SP emitting green light and a third subpixel R-SP emitting red light has the same structure as in FIG. 3. FIG. 8 further optionally provides a second emissive layer 250 having a first sub emissive layer 251 and a second sub emissive layer 252 that correspond to the second emissive layer 1210 of the second stack S2 including the first sub emissive layer 1211 having the second host h2 and the second fluorescent dopant fd2 and the second sub emissive layer 1212 having the third host h3 and the non-fluorescent dopant nfd of FIG. 7. Otherwise, a description of the same parts will be omitted or may be briefly provided.

Hereinafter, the efficiency and lifespan of the light-emitting device according to the second embodiment of the present invention will be described through experiments.

TABLE 3

| | Classification | Ex4 | Ex5 | Ex9 |
|---|---|---|---|---|
| EML structure | B-EML2 (S2) | h1 + fd2 | h2 + fd2 + pd | h3 + pd<br>h2 + fd2 |
| | B-EML1 (S1) | h1 + fd1 | h1 + fd1 | h1 + fd1 |
| Color coordinates | (CIEy at BI max) | 0.045 | 0.065 | 0.047 |
| Efficiency | BI | 319 | 430 | 386 |
| | Compared to Ex4 (%) | 100 | 135 | 121 |
| Lifespan | Compared to Ex1 (%) | — | 60 | 90 |

Referring to Table 3 and FIG. 9, it can be seen that, the lifespan of the ninth experimental example, which corresponds to the second embodiment of the present invention, is 90% of that of the first experimental example Ex1, i.e., is similar to that of a fluorescence stack. In addition, the CIEy color coordinate value thereof is 0.047, which is color purity in proportion to the fluorescence stack. This means that the blue reproduction rate of the display device is high. In addition, the efficiency thereof expressed by blue index BI is 385, which is 1.74 times 220.8 of the first experimental example Ex1. It is possible to reduce driving voltage due to increased efficiency thereof. For example, in the first experimental example Ex1 and the ninth experimental example Ex9, times at which luminance becomes 95% of the initial luminance at the same current density are measured in order to compare relative lifespan. When driving times of the ninth experimental example Ex9 and the first experimental example Ex1 at the same luminance are measured, the lifespan of the ninth experimental example Ex9 is 1.57 (1.74*0.9) times that of the first experimental example Ex1, and therefore a meaningful result can be expected in terms of lifespan when an actual display device is realized so as to have the structure of the light-emitting device according to the second embodiment of the present invention.

Hereinafter, a light-emitting display device according to one or more embodiments of the present invention will be described in connection with the structure of a thin film transistor on a substrate 100.

Figure 10:
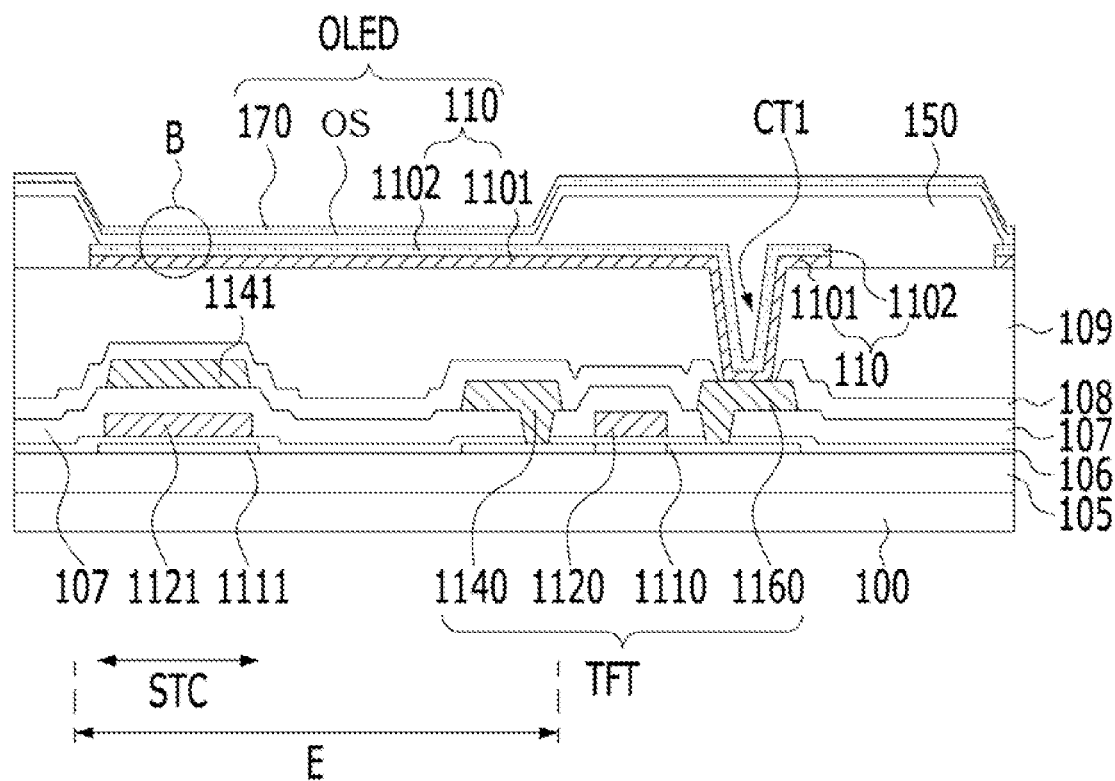
FIG. 10 is a sectional view showing a light-emitting display device according to an embodiment of the present invention.

FIG. 10 is a sectional view showing a light-emitting display device according to an embodiment of the present invention.

The structure of a thin film transistor connected to an anode 110 of each subpixel in the light-emitting display device will be described with reference to FIG. 10.

Referring to FIG. 10, a buffer layer 105 is provided on a substrate 100, and first and second semiconductor layers 1110 and 1111 are provided on the buffer layer 105. The buffer layer 105 functions to prevent impurities remaining in the substrate 100 from being introduced into the first and second semiconductor layers 1110 and 1111. Each of the first and second semiconductor layers 1110 and 1111 can be an amorphous or crystalline silicon semiconductor layer or a transparent oxide semiconductor layer. Opposite sides of the first semiconductor layer 1110 connected to a source electrode 1140 and a drain electrode 1160 can be regions into which impurities are injected. An intrinsic region between the regions of the first semiconductor layer 1110 into which the impurities are injected can function as a channel region.

Each of the first and second semiconductor layers 1110 and 1111 can include at least one of an oxide semiconductor layer, a polysilicon layer, and an amorphous silicon layer.

The second semiconductor layer 1111 can be located overlapping storage electrodes 1121 and 1141 to be formed thereon. This can be used as an auxiliary storage electrode configured to increase the capacity of a storage capacitor in the case in which impurities are injected. Depending on circumstances, the second semiconductor layer 1111 can be omitted.

A gate dielectric layer 106 is provided so as to cover the first and second semiconductor layers 1110 and 1111, and a gate electrode 1120 and a first storage electrode 1121 are formed so as to overlap the intrinsic region of the first semiconductor layer 1110 and the second semiconductor layer 1111.

A first interlayer dielectric film 107 is provided so as to cover the first and second semiconductor layers 1110 and 1111, the gate electrode 1120, and the first storage electrode 1121. 1110, the first interlayer dielectric film 107 and the gate dielectric layer 106 are selectively removed to form contact holes, and the source electrode 1140 and the drain electrode 1160 are connected to the first semiconductor layer 1110 through the contact holes. In the same process, a second storage electrode 1141 is formed on the first interlayer dielectric film 107 overlapping the first storage electrode 1121.

Here, a first thin film transistor TFT for driving an organic light-emitting device provided in an emission unit E includes a first semiconductor layer 1110, a gate electrode 1120 having a channel region overlapping therewith, and a source electrode 1140 and a drain electrode 1160 connected to opposite sides of the first semiconductor layer 1110, which are sequentially disposed from below.

In addition, a storage capacitor STC includes first and second storage electrodes 1121 and 1141 overlapping each other in the state in which the first interlayer dielectric film 107 is interposed therebetween.

A second interlayer dielectric film 108 is formed so as to cover the thin film transistor TFT and the storage capacitor STC.

Here, each of the thin film transistor TFT and the storage capacitor STC includes shading metal layers, which are disposed so as not to overlap a transmission unit T/E and thus can be disposed so as to overlap the emission unit E (RE and BE) or to overlap a bank 150 formation portion. Here, the bank 150 can be located between the transmission unit T/E and the emission unit E or between a red emission region RE and a blue emission region BE, which are spaced apart from each other, in the emission unit E. In the emission unit E, the anode 110 prevents the metal layers disposed thereunder from being visible. At a portion at which the bank 150 is located, a thick bank 150 can be disposed to prevent visibility of a lower construction.

Meanwhile, a planarization film 109 is further formed so as to planarize the second interlayer dielectric film 108 while covering the second interlayer dielectric film. The planarization film 109 and the second interlayer dielectric film 108 are selectively removed to form a connection portion CT1, via which the thin film transistor TFT and the anode 110 can be connected to each other. In FIG. 10, there is shown a two-layer structure including a reflective anode 1101 and a transparent anode 1102. Alternatively, transparent anodes can be provided in the state in which a reflective anode is interposed therebetween. For example, the reflective anode of the anode 110 is made of a reflective metal, such as aluminum, an aluminum alloy, silver, or a silver alloy. In order to improve reflection efficiency, the reflective anode can be made of an alloy, such as APC (Ag—Pd—Cu).

In addition, the cathode 170, which is opposite the anode 110, can be made of reflective and transmissive metal, such as a magnesium alloy, a silver alloy, silver, magnesium, or MgAg. Depending on circumstances, the cathode can be made of a transparent metal, such as indium tin oxide (ITO) or indium zinc oxide (IZO).

In the light-emitting display device according to the present invention, light exits through the cathode 170. A capping layer 180 can be further provided on the cathode 170 of FIG. 3 or 8 in order to increase the exit amount of light.

An organic stack OS between the anode 110 and the cathode 170 can include a plurality of stacks, in which particularly emissive layers of a first stack and a second stack in a blue subpixel B-SP are different from each other, as described with reference to FIGS. 1 to 3, 7, and 8.

The organic stack of FIG. 10 has a construction common to the emission unit E and the bank 150 of each subpixel. In the blue subpixel B-SP, the green subpixel G-SP, and the red subpixel R-SP, which emit different colors, at least the emissive layers are patterned in each emission unit so as to be separated from each other.

Meanwhile, the substrate 100 and the thin film transistor array formed on the substrate 100 can be referred to as a thin film transistor array substrate.

In the light-emitting device according to one or more embodiments of the present invention, dopant ingredients used as emissive materials of the emissive layers are different from each other in a structure in which the same color-based light (or the same color light) is emitted through a plurality of stacks, whereby both efficiency and lifespan of the light-emitting device are improved. Particularly, in the case in which the emissive layers include the same fluorescence or phosphorescent dopants in a plural stack structure, a decrease in efficiency can be caused in fluorescence emission and a decrease in lifespan is caused in phosphorescence emission. However, the embodiments of the present invention are capable of solving or addressing this limitation.

In addition, it can be difficult to increase the lifespan of a blue light-emitting device. The first stack includes a fluorescent dopant made of a single emissive material, and the second stack includes a non-fluorescent dopant, such as a phosphorescent dopant or a thermally activated delayed fluorescence dopant, together with a fluorescent dopant, whereby it is possible to improve efficiency with a predetermined lifespan or more in the second stack. In particular, the second stack is near the cathode, whereby the supply of electrons is faster than in the first stack. In the emissive layer of the second stack, action of a triplet exciton is activated, whereby it is possible to improve efficiency.

In subpixels other than the blue subpixel, phosphorescent emissive layers are provided in a plurality of stacks. Consequently, phosphorescence emission is achieved with high efficiency in the red and green subpixels, and the lifespan stabilized to red and green levels is maintained in the blue subpixel, whereby application as a display device is advantageous.

To this end, the light-emitting display device according to one or more embodiments of the present invention includes a substrate having a plurality of subpixels, an anode provided at each of the plurality of subpixels, a cathode provided over the plurality of subpixels, the cathode being opposite the anode, a charge generation layer provided between the anode and the cathode, a first stack provided between the anode and the charge generation layer, and a second stack provided between the charge generation layer and the cathode, the second stack overlapping the first stack, wherein at least one of the subpixels includes a first emissive layer having a first host and a first fluorescent dopant in the first stack and a second emissive layer configured to emit the same color-based light (or the same color light) as the first emissive layer in the second stack, the second emissive layer at least further having a non-fluorescent dopant, compared to the first emissive layer. The first emissive layer can lack the non-fluorescent dopant.

The non-fluorescent dopant can be a phosphorescent dopant or thermally activated delayed fluorescence (TADF) dopant.

The first emissive layer can be a single layer, and the second emissive layer can include a first sub emissive layer having a second host and a second fluorescent dopant and a second sub emissive layer having a third host and a non-fluorescent dopant.

The non-fluorescent dopant can have an emission peak of a longer wavelength by 1 nm or more to 30 nm or less than the emission peak of the fluorescent dopant.

The plurality of subpixels can include a blue subpixel, a green subpixel, and a red subpixel, and the first emissive layer and the second emissive layer can be included in the blue subpixel.

Only the blue subpixel can further include an electron blocking layer in at least one of the first emissive layer and the second emissive layer.

The first stack can further include a first common layer disposed under the first emissive layer and a second common layer disposed on the first emissive layer. The second stack can further include a third common layer disposed under the second emissive layer and a fourth common layer disposed on the second emissive layer. The first to fourth common layers can extend to the red subpixel and the green subpixel.

The red subpixel can have a first red emissive layer and a second red emissive layer, between which the charge generation layer is interposed, the first red emissive layer and the second red emissive layer having the same red dopants. The green subpixel can have a first green emissive layer and a second green emissive layer, between which the charge generation layer is interposed, the first green emissive layer and the second green emissive layer having the same green dopants. The first red emissive layer and the first green emissive layer can be disposed so as to have the same vertical distance from the first emissive layer with respect to the charge generation layer, and the second red emissive layer and the second green emissive layer can be disposed so as to have the same vertical distance from the second emissive layer with respect to the cathode.

The thickness of the first emissive layer can be less than the thickness of each of the first red emissive layer and the first green emissive layer, and the sum of the thicknesses of the first and second sub emissive layers can be less than the thickness of each of the second red emissive layer and the second green emissive layer.

A capping layer can be further included on the cathode, and light emitted from the first and second emissive layers can exit through the cathode and the capping layer.

In addition, a light-emitting display device according to another embodiment of the present invention includes a substrate having first to third subpixels, an anode provided at each of the first to third subpixels, a cathode provided over the first to third subpixels, the cathode being opposite the anode, a charge generation layer provided between the anode and the cathode, a first emissive layer located between the anode and the charge generation layer in the first subpixel, the first emissive layer having a first host and a first fluorescent dopant, a first sub emissive layer located between the charge generation layer and the cathode in the first subpixel, the first sub emissive layer having a second host and a second fluorescent dopant, and a second sub emissive layer abutting the first sub emissive layer, the second sub emissive layer having a third host and a non-fluorescent dopant, wherein each of the first fluorescent dopant, the second fluorescent dopant, and the non-fluorescent dopant has an emission peak at a wavelength of 435 nm to 490 nm.

The non-fluorescent dopant nfd can be a phosphorescent dopant or a thermally activated delayed fluorescence (TADF) dopant.

The sum of thicknesses of the first and second sub emissive layers can be equal to the thickness of the first emissive layer or can be different from the thickness of the first emissive layer by 50Å or less.

The second subpixel can have third and fourth emissive layers provided in the state in which the charge generation layer is interposed therebetween, each of the third and fourth emissive layers having an emission peak at a wavelength of 510 nm to 590 nm. The third subpixel can have fifth and sixth emissive layers provided in the state in which the charge generation layer is interposed therebetween, each of the fifth and sixth emissive layers having an emission peak at a wavelength of 600 nm to 650 nm.

Each of the third to sixth emissive layers can have a host and a phosphorescent dopant.

In addition, a light-emitting device according to another embodiment of the present invention includes an anode and a cathode opposite each other, a charge generation layer provided between the anode and the cathode, a first stack provided between the anode and the charge generation layer, the first stack including a first emissive layer having a first dopant and a first fluorescent dopant, and a second stack provided between the charge generation layer and the cathode, the second stack overlapping the first stack, the second stack including a second emissive layer configured to emit the same color-based light (or the same color light) as the first emissive layer, the second emissive layer at least further having a non-fluorescent dopant, compared to the first emissive layer. The first emissive layer can lack the non-fluorescent dopant.

The non-fluorescent dopant can be a phosphorescent dopant or thermally activated delayed fluorescence (TADF) dopant.

The first emissive layer can be a single layer, and the second emissive layer can include a first sub emissive layer having a second host and a second fluorescent dopant and a second sub emissive layer having a third host and a non-fluorescent dopant.

As is apparent from the above description, a light-emitting device according to one or more embodiments of the present invention and a light-emitting display device including the same have at least the following effects and/or advantages.

First, in the light-emitting device according to one or more embodiments of the present invention, dopant ingredients used as emissive materials of emissive layers are different from each other in a structure in which the same color-based light (or the same color light) is emitted through a plurality of stacks, whereby both efficiency and lifespan of the light-emitting device are improved. Particularly, in the case in which the emissive layers include the same fluorescence or phosphorescent dopants in a plural stack structure, a decrease in efficiency is caused in fluorescence emission and a decrease in lifespan is caused in phosphorescence emission. However, the present invention is capable of address this limitation effectively.

Second, it can be difficult to increase the lifespan of particularly a blue light-emitting device. To address, in the embodiments of the present invention, a first stack includes a fluorescent dopant made of a single emissive material, and a second stack includes a non-fluorescent dopant, such as a phosphorescent dopant or a thermally activated delayed fluorescence dopant, together with a fluorescent dopant, whereby it is possible to improve efficiency with a predetermined lifespan or more in the second stack. In particular, the second stack is near a cathode, whereby the supply of electrons is faster than in the first stack. In the emissive layer of the second stack, action of a triplet exciton is activated, whereby it is possible to improve efficiency.

Third, in the subpixels other than the blue subpixels, phosphorescent emissive layers are provided in a plurality of stacks. Consequently, phosphorescence emission is achieved with high efficiency in the red and green subpixels, and the lifespan stabilized to red and green levels is maintained in the blue subpixel, whereby such configuration is advantageous to be used in a display device.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. A light-emitting display device comprising:
a substrate having a plurality of subpixels;
an anode at each of the plurality of subpixels;
a cathode over the plurality of subpixels;
a charge generation layer between the anode and the cathode;
a first stack between the anode and the charge generation layer; and
a second stack between the charge generation layer and the cathode, the second stack overlapping the first stack,
wherein at least one subpixel of the plurality of subpixels comprises a first emissive layer having a first host and a first fluorescent dopant in the first stack, and a second emissive layer having a second host and a second fluorescent dopant in the second stack,
the second emissive layer configured to emit a same color-based light as the first emissive layer,
wherein the second emissive layer overlaps the first emissive layer and further includes a non-fluorescent dopant than that of the first emissive layer,
wherein the non-fluorescent dopant in the second emissive layer has an emission peak of a longer wavelength by approximately 1 nm or more to approximately 30 nm or less than an emission peak of the first fluorescent dopant in the first emissive layer, and
wherein the second host has a photoluminescence (PL) spectrum that overlaps a PL spectrum of the second fluorescent dopant, and the second host has a higher triplet state than that of the non-fluorescent dopant.

2. The light-emitting display device according to claim 1, wherein the non-fluorescent dopant is at least one of a phosphorescent dopant and a thermally activated delayed fluorescence (TADF) dopant.

3. The light-emitting display device according to claim 1, wherein:
the first emissive layer is a single layer, and
the second emissive layer comprises a first sub emissive layer having the second host and the second fluorescent dopant, and a second sub emissive layer having a third host and the non-fluorescent dopant.

4. The light-emitting display device according to claim 3, wherein:
a subpixel adjacent to the at least one subpixel having the first and second emissive layers has a third emissive layer and a fourth emissive layer configured to emit a color light different from a color light emitted by the first and second emissive layers, the third emissive layer and the fourth emissive layer overlapping each other, a thickness of the first emissive layer is less than a thickness of the third emissive layer, and a sum of thicknesses of the first and second sub emissive layers is less than a thickness of the fourth emissive layer.

5. The light-emitting display device according to claim 1, wherein:

the plurality of subpixels comprise a blue subpixel, a green subpixel, and a red subpixel, and the first emissive layer and the second emissive layer are included in the blue subpixel.

6. The light-emitting display device according to claim 5, wherein only the blue subpixel further comprises an electron blocking layer adjacent to at least one of the first emissive layer and the second emissive layer.

7. The light-emitting display device according to claim 5, wherein:

the first stack further comprises a first common layer provided under the first emissive layer, and a second common layer provided on the first emissive layer, the second stack further comprises a third common layer provided under the second emissive layer, and a fourth common layer provided on the second emissive layer, and the first to fourth common layers extend to the red subpixel and the green subpixel.

8. The light-emitting display device according to claim 5, wherein:

the red subpixel has a first red emissive layer and a second red emissive layer, between which the charge generation layer is interposed, the first red emissive layer and the second red emissive layer having identical red dopants, the green subpixel has a first green emissive layer and a second green emissive layer, between which the charge generation layer is interposed, the first green emissive layer and the second green emissive layer having identical green dopants, the first red emissive layer and the first green emissive layer having an identical vertical distance from the first emissive layer with respect to the charge generation layer, and the second red emissive layer and the second green emissive layer having an identical vertical distance from the second emissive layer with respect to the cathode.

9. The light-emitting display device according to claim 1, further comprising:

a capping layer provided on the cathode, wherein light emitted from the first and second emissive layers exits through the cathode and the capping layer.

10. A light-emitting display device comprising:

a substrate having a first subpixel, a second subpixel and a third subpixel;

an anode at each of the first to third subpixels;

a cathode over the first to third subpixels;

a charge generation layer between the anode and the cathode;

a first emissive layer between the anode and the charge generation layer in the first subpixel, the first emissive layer having a first host and a first fluorescent dopant;

a first sub emissive layer between the charge generation layer and the cathode in the first subpixel, the first sub emissive layer having a second host and a second fluorescent dopant; and a second sub emissive layer abutting the first sub emissive layer, the second sub emissive layer having a third host and a non-fluorescent dopant, wherein the first sub emissive layer and the second sub emissive layer overlap the first emissive layer, wherein each of the first fluorescent dopant, the second fluorescent dopant, and the non-fluorescent dopant has an emission peak at a wavelength of approximately 435 nm to 490 nm, and wherein the second host has a photoluminescence (PL) spectrum that overlaps a PL spectrum of the second fluorescent dopant, and the second host has a higher triplet state than that of the non-fluorescent dopant.

11. The light-emitting display device according to claim 10, wherein the non-fluorescent dopant is at least one of a phosphorescent dopant and a thermally activated delayed fluorescence (TADF) dopant.

12. The light-emitting display device according to claim 10, wherein a sum of thicknesses of the first and second sub emissive layers is either equal to a thickness of the first emissive layer or is different from the thickness of the first emissive layer by approximately 50 Å or less.

13. The light-emitting display device according to claim 10, wherein:

the second subpixel has a third emissive layer and a fourth emissive layer, in which the charge generation layer is interposed therebetween, each of the third and fourth emissive layers having an emission peak at a wavelength of approximately 510 nm to 590 nm, and the third subpixel has a fifth emissive layer and a sixth emissive layer, in which the charge generation layer is interposed therebetween, each of the fifth and sixth emissive layers having an emission peak at a wavelength of approximately 600 nm to 650 nm.

14. The light-emitting display device according to claim 13, wherein each of the third to sixth emissive layers has a host and a phosphorescent dopant, respectively.

15. A light-emitting device comprising:

an anode and a cathode opposite each other;

a charge generation layer between the anode and the cathode;

a first stack between the anode and the char generation layer, the first stack comprising a first emissive layer having a first dopant and a first fluorescent dopant; and a second stack between the charge generation layer and the cathode, the second stack overlapping the first stack, the second stack comprising a second emissive layer configured to emit a same color-based light as the first emissive layer, the second emissive layer having a second host, a second fluorescent dopant, and a non-fluorescent dopant, wherein the second emissive layer overlaps the first emissive layer on at least one subpixel, wherein the non-fluorescent dopant in the second emissive layer has an emission peak of a longer wavelength by approximately 1 nm or more to approximately 30 nm or less than an emission peak of the first fluorescent dopant in the first emissive layer, and wherein the second host has a photoluminescence (PL) spectrum that overlaps a PL spectrum of the second fluorescent dopant, and the second host has a higher triplet state than that of the non-fluorescent dopant.

16. The light-emitting device according to claim 15, wherein the non-fluorescent dopant is at least one of a phosphorescent dopant and a thermally activated delayed fluorescence (TADF) dopant.

17. The light-emitting device according to claim 15, wherein:

the first emissive layer is a single layer, and the second emissive layer comprises a first sub emissive layer having the second host and the second fluorescent dopant, and a second sub emissive layer having a third host and the non-fluorescent dopant.

* * * * *